(12) United States Patent
Osaki et al.

(10) Patent No.: US 8,487,638 B2
(45) Date of Patent: Jul. 16, 2013

(54) ELECTRICAL CAPACITANCE SENSOR

(75) Inventors: Takuya Osaki, Sakura (JP); Masahiro Kondo, Sakura (JP); Koji Sakiyama, Sakura (JP)

(73) Assignee: Fujikura Ltd., Tokyo (JP)

( * ) Notice: Subject to any disclaimer, the term of this patent is extended or adjusted under 35 U.S.C. 154(b) by 348 days.

(21) Appl. No.: 13/023,012

(22) Filed: Feb. 8, 2011

(65) Prior Publication Data

US 2011/0163763 A1 Jul. 7, 2011

Related U.S. Application Data

(63) Continuation of application No. PCT/JP2009/070297, filed on Dec. 3, 2009.

(30) Foreign Application Priority Data

Dec. 4, 2008 (JP) .................................. 2008-309408

(51) Int. Cl.
*G01R 27/26* (2006.01)
(52) U.S. Cl.
USPC ........... 324/658; 324/686; 324/688; 340/562; 340/686.6
(58) Field of Classification Search
USPC ................ 324/679, 686, 688, 690, 519, 658, 324/661; 340/562, 686.6
See application file for complete search history.

(56) References Cited

U.S. PATENT DOCUMENTS

| | | | | |
|---|---|---|---|---|
| 4,766,368 A | * | 8/1988 | Cox | ............................... 324/688 |
| 5,844,486 A | * | 12/1998 | Kithil et al. | ................ 340/573.4 |
| 6,249,130 B1 | * | 6/2001 | Greer | ............................. 324/687 |
| 6,828,806 B1 | * | 12/2004 | Hirota et al. | .................. 324/688 |
| 7,161,360 B2 | * | 1/2007 | Hirota et al. | .................. 324/688 |
| 7,853,381 B2 | * | 12/2010 | Iyoda | ............................... 701/45 |
| 2005/0140378 A1 | | 6/2005 | Hirota et al. | |
| 2007/0115120 A1 | | 5/2007 | Ito et al. | |

FOREIGN PATENT DOCUMENTS

| | | |
|---|---|---|
| JP | 2001-094408 A | 4/2001 |
| JP | 2002-062105 A | 2/2002 |
| JP | 2007-139555 A | 6/2007 |

OTHER PUBLICATIONS

International Search Report of PCT/JP2009/070297, mailing date Feb. 23, 2010.
Japanese Office Action dated Oct. 9, 2012, issued in corresponding Japanese Patent Application No. 2010-541345 (2 pages), citing JP2001-94408 and JP2007-139555 which were already submitted on Feb. 8, 2011.

(Continued)

*Primary Examiner* — Arleen M Vazquez
(74) *Attorney, Agent, or Firm* — Westerman, Hattori, Daniels & Adrian, LLP

(57) ABSTRACT

Disclosed is an electrical capacitance sensor comprising: a board 10 having a one main surface and an other main surface; a sensor electrode 26 formed on the one main surface of the board 10 and detecting an electrical capacitance between the sensor electrode 26 and an object; a first guard electrode 25 formed on the one main surface of the board 10 and in a vicinity of the sensor electrode 26; and a second guard electrode 27 formed on the other main surface of the board 10, wherein a first terminal connecting portion 21 for the first guard electrode 25 and a second terminal connecting portion 23 for the second guard electrode 27 are provided at positions opposing each other.

5 Claims, 13 Drawing Sheets

OTHER PUBLICATIONS

Korean Office Action dated Jan. 8, 2013, issued in corresponding Korean application No. 10-2011-7002803.

Korean Office Action mailed Jul. 13, 2012, issued in corresponding application No. 10-2011-7002803.

* cited by examiner

ELECTRICAL CAPACITANCE SENSOR

BACKGROUND OF THE INVENTION

1. Technical Field of the Invention

The present invention relates to an electrical capacitance sensor.

It is to be noted that, for certain designated countries which permit the incorporation by reference, the contents described and/or illustrated in the documents relevant to Japanese Patent Application No. 2008-309408 filed on Dec. 4, 2008 and International Patent Application PCT/JP2009/070297 filed on Dec. 3, 2009 will be incorporated herein by reference, as a part of the description and/or drawings of the present application.

2. Background Art

For an electrical capacitance sensor having a film-based electrode section obtained by forming an antenna electrode and a ground electrode on the front surface of a film, known in the art is a technique of forming an additional ground electrode also on the rear surface of the film in order to prevent an erroneous detection (Patent Document 1). In such an electrical capacitance sensor, the antenna electrode and the ground electrodes are connected to a sensor circuit provided on another independent board via a connector, and the sensor circuit controls applying a certain voltage to the ground electrodes and detecting the value of a capacitance induced between the antenna electrode and an object.

[Patent Document 1] Japanese Patent Application Publication No. 2007-139555

SUMMARY OF THE INVENTION

In the case of providing an additional electrode on the rear surface of a film, however, it is required to provide an additional terminal connecting portion for connecting the additional electrode to a sensor circuit on another independent board. Therefore, the problem is that the width size of a connecting section (a part to which a connector is attached) becomes large due to the additional terminal connecting portion.

The object of the present invention is to provide an electrical capacitance sensor having a small width size of the connecting section in spite of being provided with an electrode on the rear surface of a board.

Means for Solving the Problems

The present invention provides, for the purpose of solving the above problem, an electrical capacitance sensor comprising: a board having a one main surface and an other main surface; a sensor electrode formed on the one main surface of the board and detecting an electrical capacitance between the sensor electrode and an object; a first guard electrode formed on the one main surface of the board and in a vicinity of the sensor electrode; and a second guard electrode formed on the other main surface of the board, wherein a first terminal connecting portion for the first guard electrode and a second terminal connecting portion for the second guard electrode are provided at positions opposing each other.

In the present invention, the electrical capacitance sensor may further comprise: a third terminal connecting portion for the sensor electrode, the third terminal connecting portion being formed on the one main surface of the board; and a dummy terminal connecting portion formed at a position opposing the third terminal connecting portion and on the other main surface of the board, and the dummy terminal connecting portion may have a height approximately equal to a height of the second terminal connecting portion.

In the present invention, a terminal clamp having a pair of clamping plates for clamping the board from both surface sides may be attached to each of a pair of the first terminal connecting portion and the second terminal connecting portion and a pair of the third terminal connecting portion and the dummy terminal connecting portion.

In the present invention, the dummy terminal connecting portion may be formed of a conductive material same as for the second terminal connecting portion.

In the present invention, a pair of the third terminal connecting portion and the dummy terminal connecting portion opposing each other may comprise a plurality of pairs of the third terminal connecting portions and the dummy terminal connecting portions, and the plurality of pairs may be arranged in substantially parallel to one another.

In the present invention, the board may be provided as a membrane having an electrode section.

Advantageous Effect of the Invention

According to the present invention, the first terminal connecting portion for the first guard electrode provided on one main surface of the board and the second terminal connecting portion for the second guard electrode provided on the other main surface are located at positions opposing each other. Therefore, it is enabled that the width size of a connecting section including the first terminal connecting portion and the second terminal connecting portion does not become large even though the second guard electrode is formed on the other main surface of the board. As a result, the present invention provides an electrical capacitance sensor having a small connecting section while improving the detection accuracy thereof.

DESCRIPTION OF THE PREFERRED EMBODIMENT

An electrical capacitance sensor 100 according to embodiments of the present invention will be described with reference to the drawings.

Hereinafter, the description will be directed illustratively to an embodiment in which the electrical capacitance sensor 100 according to the present embodiment is used as a sensor detecting a head position of an occupant seated at a vehicle seat.

Figure 1:
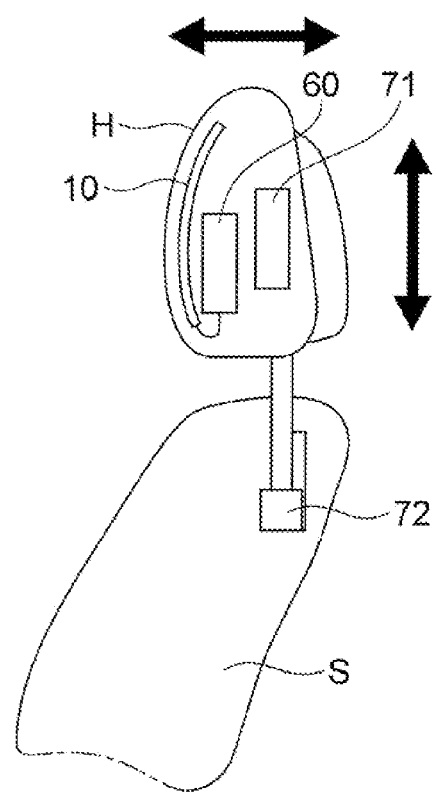
FIG. 1 is a view illustrating a headrest position adjusting apparatus using the electrical capacitance sensor according to the first embodiment of the present invention.
Figure 2:
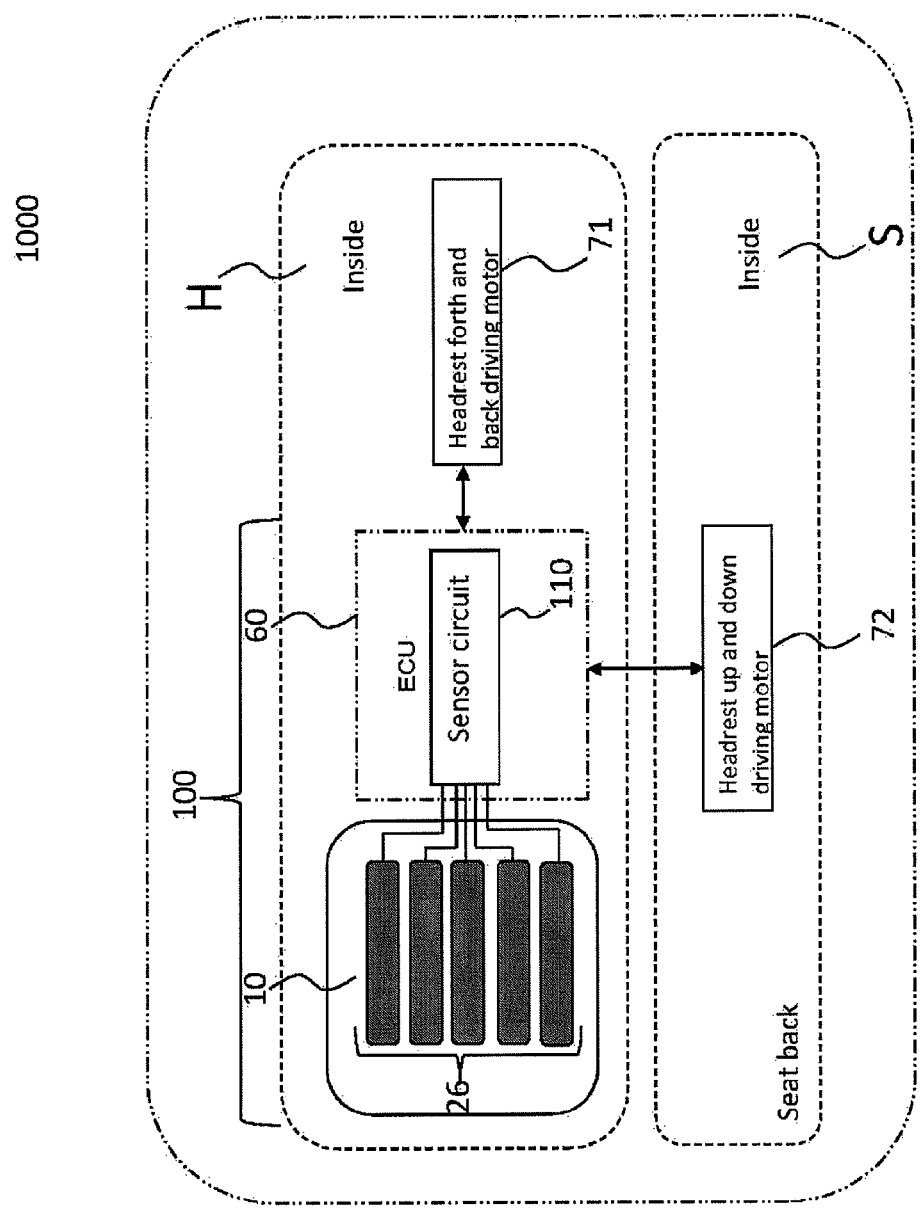
FIG. 2 is a block diagram illustrating the headrest position adjusting apparatus shown in FIG. 1.

FIGS. 1 and 2 are views illustrating a headrest position adjusting apparatus 1000 to adjust a position of a headrest H in a vehicle in response to the head position of an occupant detected by the electrical capacitance sensor 100 according to the present embodiment.

The headrest position adjusting apparatus 1000 shown in FIGS. 1 and 2 has the electrical capacitance sensor 100, an in-vehicle computer such as ECU (Electronic Control Unit) 60, and a headrest forth and back driving motor 71 provided in the headrest H, and a headrest up and down driving motor 72 provided in a seat back S.

The electrical capacitance sensor 100 has an electrode section 10 with a board arranged such that the main surface of the board is along the surface of the headrest H, and a sensor circuit 110 provided on another board different from the board of the electrode section 10. The electrode section 10 and the sensor circuit 110 are connected to each other via a connector.

On one main surface side (front surface side) of the electrode section 10, five sensor electrodes 26 are formed so as to be arranged in substantially parallel to one another along the height direction of the headrest H. Each sensor electrode 26 independently detects an electrical capacitance and outputs each detected electrical capacitance to the sensor circuit 110.

The sensor circuit 110 outputs a detecting signal depending on the obtained electrical capacitance to the ECU 60. Although the electrical capacitance sensor 100 is illustrated as being provided with five sensor electrodes 26 in the present embodiment, the number of the sensor electrodes 26 is not particularly limited.

The ECU 60 controls the headrest forth and back driving motor 71 based on a distance, detected by the electrical capacitance sensor 100, between the surface of the headrest H and the head of occupant (distance between the sensor electrodes and the head of occupant). The headrest forth and back driving motor 71 moves the headrest H forth and back in accordance with a control instruction from the ECU 60. In this control, the calculation method of the distance between the surface of the headrest H and the head of occupant is not particularly limited. For example, the nearest distance out of the distances detected by the plurality of sensor electrodes 26 with different heights thereof may be determined as the distance between the surface of the headrest H and the head of occupant.

Similarly, the ECU 60 also controls the headrest up and down driving motor 72 based on a height of the occupant's head detected by the electrical capacitance sensor 100. The headrest up and down driving motor 72 moves the headrest H up and down in accordance with a control instruction from the ECU 60. In this control, the calculation method of the height of the occupant's head is not particularly limited. For example, the height of the occupant's head can be obtained from an estimated result through detecting distances, each between the surface of the headrest H and the occupant's head, respectively by the plurality of the sensor electrodes 26 arranged in substantially parallel to one another along the height direction of the headrest H, determining which sensor electrode 26 is detecting the nearest distance, and estimating the height of the occupant's head in accordance with the height position of the determined sensor electrode 26.

Figure 3:
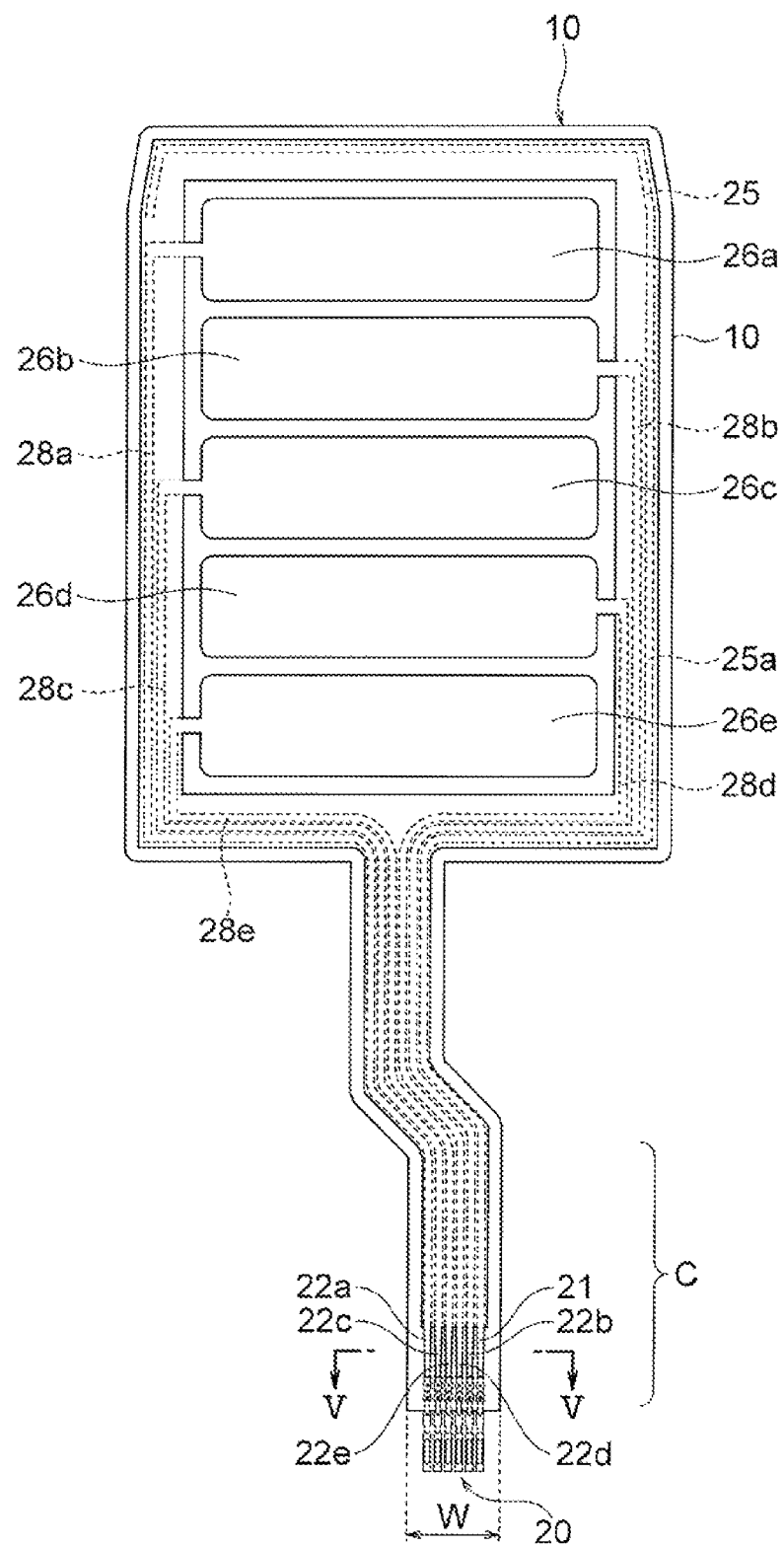
FIG. 3 is a plan view illustrating a board of the electrical capacitance sensor according to the first embodiment of the present invention.
Figure 4:
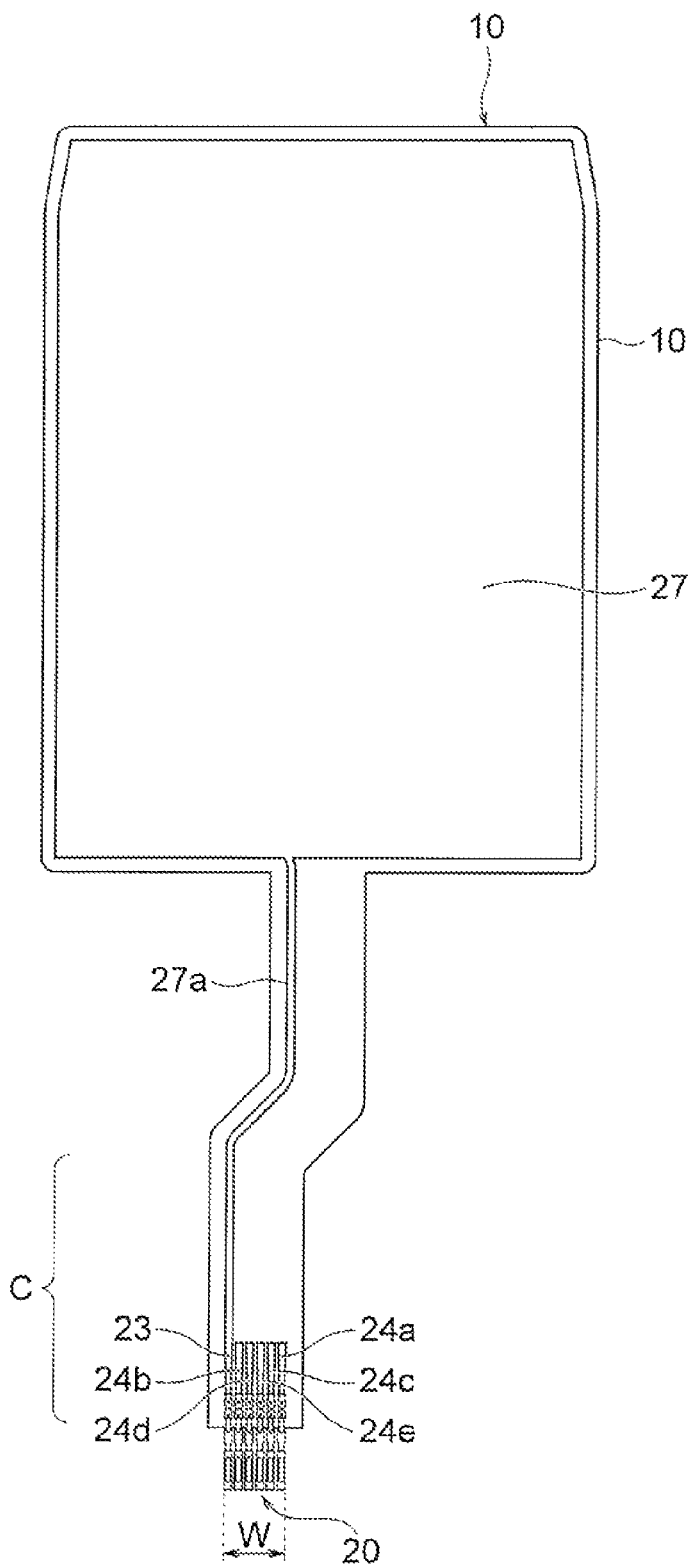
FIG. 4 is a rear view illustrating the board of the electrical capacitance sensor shown in FIG. 3.
Figure 5:
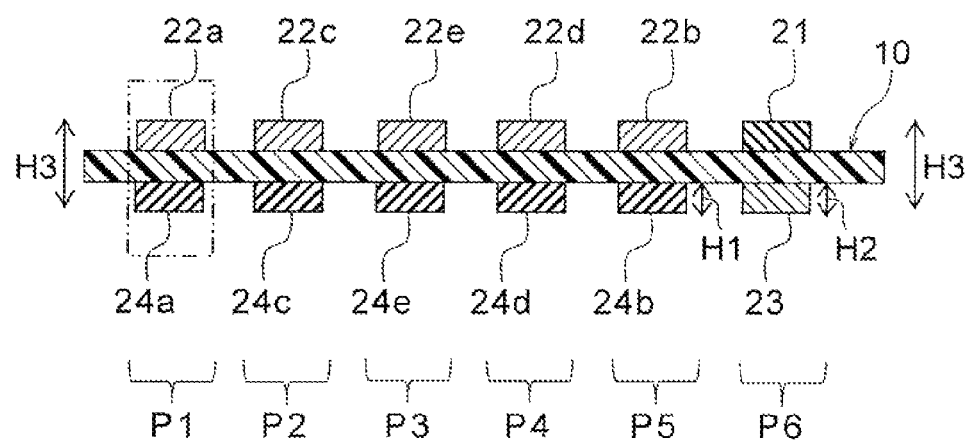
FIG. 5 is a cross sectional view along the line V-V in FIG. 3.

The following description with reference to FIGS. 3 to 5 is directed to the electrical capacitance sensor 100 according to the present embodiment. FIG. 3 is a plan view of a board 10 on which electrodes of the electrical capacitance sensor according to the present embodiment are formed, FIG. 4 is a rear view thereof, and FIG. 5 is a cross sectional view along the line V-V in FIG. 3.

As shown in FIG. 3, formed on one main surface of the board are sensor electrodes 26a to 26e each for detecting an electrical capacitance between each sensor electrode and an object, and a first guard electrode 25 formed in the vicinity of the sensor electrodes 26a to 26e, more specifically formed around the sensor electrodes 26a to 26e.

The sensor electrodes 26a to 26e are connected with third terminal connecting portions 22a to 22e respectively via connecting wirings 28a to 28e, and the first guard electrode 25 is connected with a first terminal connecting portion 21 via a connecting wiring 25a. Although not shown, an additional first guard electrode 25 may be provided on an upper layer of a laminated board configured as the board 10 such that the additional first guard electrode 25 is located via an insulating layer above the connecting wirings 28a to 28e connected with the sensor electrodes 26a to 26e. In this case, the first terminal connecting portion 21 may be common for the two first guard electrodes 25 by providing a contact therebetween at a certain position of the first guard electrode 25 shown in FIG. 3.

On the other hand, as shown in FIG. 4, a second guard electrode 27 is formed on the other main surface (rear surface) of the board 10. The second guard electrode 27 is connected with a second terminal connecting portion 23 via a connecting wiring 27a. In addition, five dummy terminal connecting portions 24a to 24e are provided in parallel to one another and adjacently to and parallelly to the second terminal connecting portion 23.

Thus, essential parts constituting a connecting section 20 are the first terminal connecting portion 21 and the third terminal connecting portions 22a to 22e provided on the one main surface side of the board 10 and the second terminal connecting portion 23 and the dummy terminal connecting portions 24a to 24e provided on the other main surface side of the board.

FIG. 5, which is a cross sectional view along the line V-V in FIG. 3, illustrates a cross section of the connecting section 20 including the first terminal connecting portion 21, the second terminal connecting portion 23, the third terminal connecting portions 22a to 22e, and the dummy terminal connecting portions 24a to 24e.

As shown in FIG. 5, the first terminal connecting portion 21 for the first guard electrode 25 and the second terminal connecting portion 23 for the second guard electrode 27 are provided at positions opposing each other on both main surfaces of the board 10.

For the common purpose to cut off external noises reaching the sensor electrodes 26a to 26e, the first guard electrode 25 and the second guard electrode 27 are provided respectively on the one main surface and the other main surface of the board 10. Therefore, both the guard electrodes 25 and 27 are to be applied same voltage and to perform similarly in spite of being provided on which surface of the board 10. As a result of focusing attention on this point by the inventors, features of the present embodiment include that the first terminal connecting portion 21 for the first guard electrode 25 and the second terminal connecting portion 23 for the second guard electrode 27, which have same performances, are provided at positions opposing each other on both main surfaces of the board 10, that a single terminal clamp is attached to the pair of terminal connecting portions (terminal connecting portion pair P6) opposing each other, and that a certain voltage is applied to these terminal connecting portions. According to the features of the present embodiment, it is prevented that the number of terminal clamps 5 to be attached to the connecting section 20 increases. In other words, even though the second guard electrode 27 is added onto the other main surface side of the board 10, the width size W (refer to FIG. 3) of the connecting section 20 including the first terminal connecting portion 21 and the second terminal connecting portion 23 is prevented from becoming large, and it is enabled to reduce the width size W of the connecting section 20.

Moreover, as shown in FIG. 5, the dummy terminal connecting portions 24a to 24e are provided on the other main surface side of the board 10 and at positions opposing respectively the third terminal connecting portions 22a to 22e. As shown in the same figure, each of the third terminal connecting portions 22a to 22e provided on the one main surface side of the board 10 becomes paired together with each of the dummy terminal connecting portions 24a to 24e provided on the other main surface side of the board 10, and therefore five terminal connecting portion pairs P1 to P5 each being counterparts are arranged in substantially parallel to one another.

Each dummy terminal connecting portion 24 is formed to have the height (thickness) H1 thereof approximately equal to the height (thickness) H2 of the second terminal connecting portion 23. Accordingly, the heights H1 and H2 on the other main surface side of the connecting section 20 can be obtained evenly. As a result, the height H3 of a connecting region C (FIGS. 3 and 4) may become uniformly even. Thus, in the connecting region C, the height H3 of the terminal connecting portion pair P6 comprising the first terminal connecting portion 21 and the second terminal connecting portion 23 becomes even with the heights H3 of the terminal connecting portion pairs P1 to P5 comprising the third terminal connecting portions 22a to 22e and the dummy terminal connecting portions 24a to 24e. Therefore, when each terminal connecting portion pair is electrically conducted by using each terminal clamp 5 such that a pair of clamping plates provided with the terminal clamp 5 holds the terminal connecting portion pair therebetween from both main surface sides of the board 10, the variation of connecting conditions (pressing forces and the like) is suppressed, thereby improving a connecting reliability.

The connecting section 20, which includes the terminal connecting portion pair P6 comprising the first terminal connecting portion 21 and the second terminal connecting portion 23 and the terminal connecting portion pairs P1 to P5 comprising the third terminal connecting portions 22a to 22e and the dummy terminal connecting portions 24a to 24e, is electrically connected with the sensor circuit 110 shown in FIG. 2 in such a manner that the pair of clamping plates provided with each of six terminal clamps 5 to be described later holds each terminal connecting portion pair therebetween from both main surface sides of the board 10.

Figure 6:
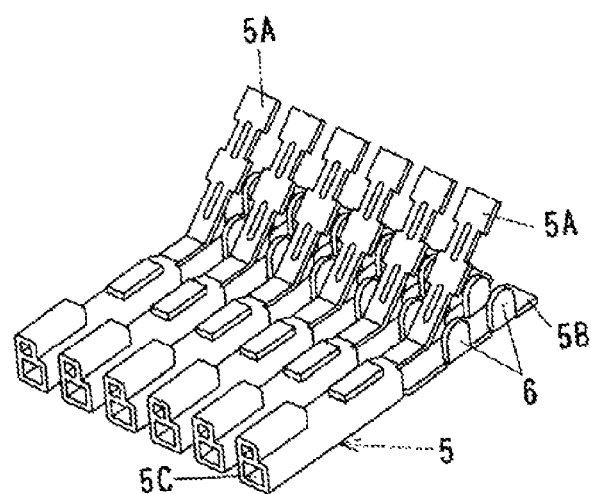
FIG. 6 is a perspective view illustrating terminal clamps of the electrical capacitance sensor according to the first embodiment of the present invention.
Figure 7:
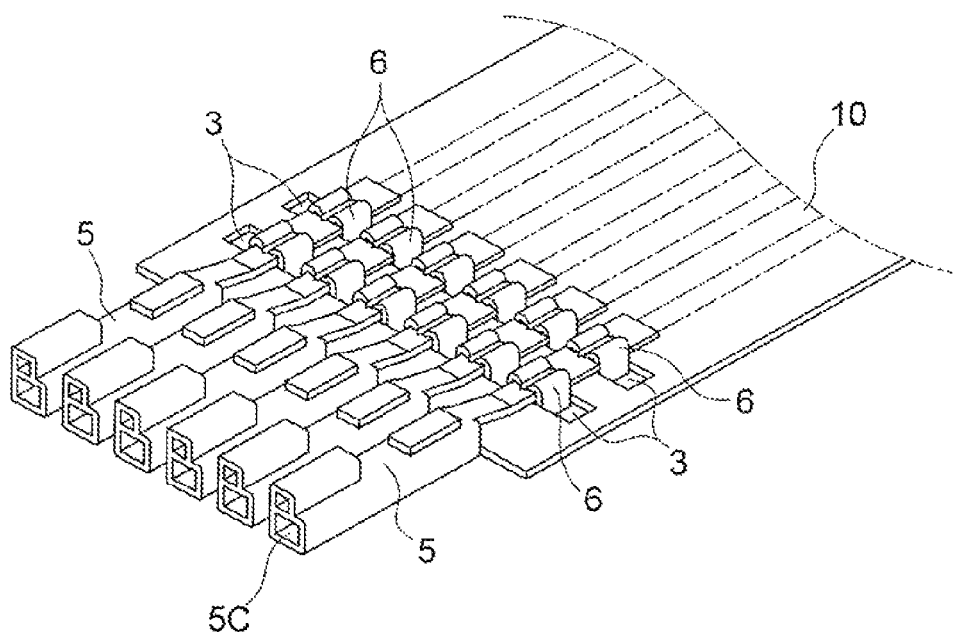
FIG. 7 is a perspective view illustrating a condition where the terminal clamps shown in FIG. 6 clamp the board.
Figure 8:
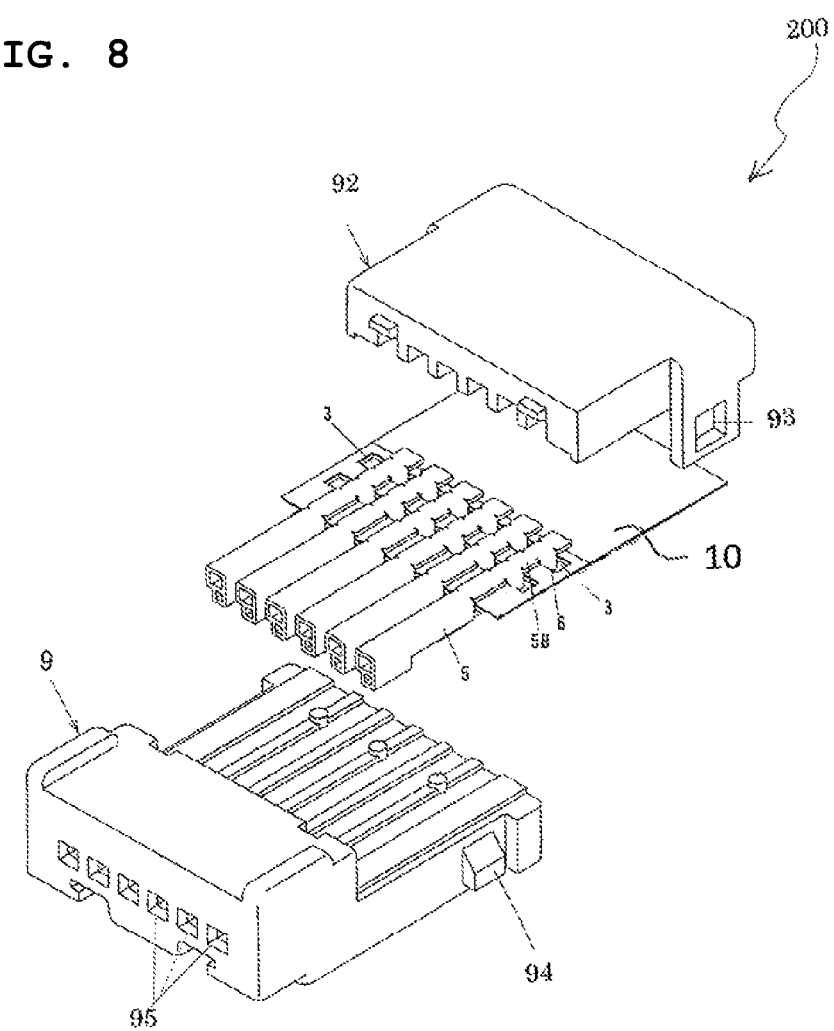
FIG. 8 is an exploded perspective view illustrating a connector.

Then, referring to FIGS. 6 to 8, the terminal clamps 5 and a connector 200 provided therein with the terminal clamps 5 according to the present embodiment will be described. FIGS. 6 and 7 are perspective views each illustrating the terminal clamps 5, and FIG. 8 is an exploded perspective view illustrating the connector 200 including the terminal clamps 5.

As shown in FIG. 6, each of the terminal clamps 5 according to the present embodiment is configured of an electrically conductive material and is provided with a pair of clamping plates 5A and 5B for holding the board 10 not shown in FIG. 6. The clamping plate 5B has barrels 6 (hooks 6) capable of being swaged into barrel shapes. Each terminal clamp 5 has an insertion opening 5C formed at one end side thereof into which a male terminal is to be inserted. As shown in FIG. 5, six terminal connecting portion pairs P1 to P6 are provided with certain intervals according to the present embodiment, and therefore six terminal clamps 5 are provided with the certain intervals.

FIG. 7 illustrates the terminal clamps 5 in a condition where the barrels 6 have been swaged by using a jig or a tool not shown. As shown in FIG. 7, six terminal clamps 5 are fixed to the connecting section 20 of the board 10 with intervals corresponding to the certain intervals of the terminal connecting portion pairs P1 to P6.

The clamping plates 5A and 5B are fixed to each of the terminal connecting portion pairs P1 to P6 through the following steps: a step where the terminal clamps 5 are set such that each of the terminal connecting portion pairs P1 to P6 is located between each pair of the clamping plates 5A and 5B; a step where the tops of the barrels 6 projecting from each clamping plate 5B are passed through openings 3 provided at the board 10; a step where each of the terminal connecting portion pairs P1 to P6 are clamped between the each pair of the clamping plates 5A and 5B; and a step where the barrels 6 are swaged such that the clamping plates 5A and 5B are pressed towards the board 10 from both main surface sides thereof. As a result, the connecting section 20, which includes the terminal connecting portion pair P6 comprising the first terminal connecting portion 21 and the second terminal connecting portion 23 and the terminal connecting portion pairs P1 to P5 comprising the third terminal connecting portions 22 and the dummy terminal connecting portions 24, is fixed to the terminal clamps 5 so as to be clamped respective clamping plates 5A and 5B.

FIG. 8 is an exploded perspective view illustrating a situation where the terminal connecting portion pairs P1 to P6 and the terminal clamps 5 are placed in a connector housing 9 after being connected with one another. The connector housing 9 has an engaging projection 94 to be engaged into an engaging opening 93 of a cover 92 provided with the connector housing 9, and the positions of the terminal clamps 5 are determined after the engaging opening 93 being engaged with the engaging projection 94. Although not shown, terminal plugs of the counterpart connector connected with the sensor circuit 110 shown in FIG. 2 are inserted into six openings 95 of the connector housing 9, thereby the sensor electrodes 26a to 26e, the first guard electrode 25, and the second guard electrode 27 are electrically connected to the sensor circuit 110.

Hereinafter, a production method will be described. Although not limited, the electrical capacitance sensor 100 according to the present embodiment is a sensor having an electrode section with a board of membrane. More specifically, the electrode section is obtained by forming electrodes and wirings through a printing method on the surface of an insulating base material with flexibility.

At first, an insulating base material for constituting the board 10 is prepared. A resin material may be used as the insulating base material because of having significant flexibility. Examples thereof include resin films such as polyimide-based film, polyamide-based resin film, polyethylene terephthalate film, and polyethylene naphthalate film.

Next, through screen printing conductive paste onto one main surface of the insulating base material, the sensor electrodes 26a to 26e, the connecting wirings 28a to 28e, the third terminal connecting portions 22a to 22e, the first guard electrode 25, the connecting wiring 25a, and the first terminal connecting portion 21 are formed on the insulating base material. Examples of the conductive paste include paste obtained by dispersing conductive filler of metal powder, such as silver, platinum, gold, copper, nickel, and palladium, into binder resin. It is to be noted that the printing method of the conductive paste is not particularly limited, and a method known in the art is available.

Then, through printing conductive paste onto the other main surface of the insulating base material, the second guard electrode 27, the connecting wiring 27a, the second terminal connecting portion 23, and the dummy terminal connecting portions 24 are formed on the insulating base material. Same manner as for the sensor electrodes 26 and the like is available as the printing method.

According to the present embodiment, the dummy terminal connecting portions 24 are formed of the same conductive materials as for the second terminal connecting portion 23. Therefore, the second terminal connecting portion 23 and the dummy terminal connecting portions 24a to 24e can be formed through a single printing process. Thus, a particular process for providing the dummy terminal connecting portions 24a to 24e is unnecessary because the second terminal connecting portion 23 and the dummy terminal connecting portions 24a to 24e are simultaneously formed.

Finally, in order to obtain the connector 200 by using the terminal clamps 5, after setting each terminal connecting portion pair of the first terminal connecting portion 21 and the second terminal connecting portion 23 opposing each other and the third terminal connecting portions 22a to 22e and the dummy terminal connecting portions 24a to 24e opposing similarly one another between each one pair of the clamping plates 5A and 5B of the terminal clamp 5 and passing the barrels 6 into the openings 3, the barrels 6 of one clamping plate 5B are swaged onto the other clamping plate 5A. By swaging respective barrels 6 of the terminal clamps 5, a pressing force is generated between each pair of the clamping plates 5A and 5B of the terminal clamp 5 towards the board 10 from both main surface sides thereof such that the each pair of the clamping plates 5A and 5B clamps each pair, opposing each other, of the terminal connecting portion pairs P1 to P6. Through this, the electrode section 10 applied with the connector 200 can be obtained. The electrode section 10 is connected with the sensor circuit 110 on another board via the connector 200, thereby providing the electrical capacitance sensor 100.

As described above, the electrical capacitance sensor 100 according to the present embodiment has a configuration where the first terminal connecting portion 21 for the first guard electrode 25 formed on one main surface of the board 10 and the second terminal connecting portion 23 for the second guard electrode 27 formed on the other main surface of the board 10 are arranged so as to oppose each other. Therefore, both the first terminal connecting portion 21 and the second terminal connecting portion 23 can be connected with one terminal clamp 5.

Thus, the electrical capacitance sensor 100 according to the present embodiment is configured such that the first terminal connecting portion 21 and the second terminal connecting portion 23 are arranged to be opposed each other. Therefore, in the case of forming the second guard electrode 27 on the other main surface of the board 10 as the above embodiment, it is unnecessary to ensure an additional region to be assigned to the second terminal connecting portion 23 for the second guard electrode 27. Accordingly, the width size W (refer to FIG. 3) of the connecting section 20, to which the terminal clamps 5 are fixed, is prevented from increasing, thereby providing the electrical capacitance sensor 100 with a small width size W of the connecting section 20. Moreover, because the number of the terminal clamps 5 to be connected with the connecting section 20 is common for the cases that the guard electrodes 25 and 27 are provided on both main surfaces of the board 10 and that the guard electrode 25 is provided only on one main surface of the board 10, connectors according to common specs are available for connecting sections 20 of these cases.

Incidentally, in the case of providing the electrical capacitance sensor 100 in the headrest H as the present embodiment, the electrode section 10 is arranged so as to be along the front surface of the headrest H, and the sensor circuit 110 is located at the rear side of the headrest H. Therefore, it is required that a penetrating hole is formed in a cushion material (sponge) of the headrest H in order for the connector 200 of the board 10 to pass through from the front surface side to the rear surface side of the headrest H. Because the size of the penetrating hole is determined in accordance with the width size of the connector 200, the penetrating hole becomes large as the connector 200 becomes large. If the penetration hole is large, the occupant contacting with the headrest H may be bothered by a feeling of strangeness. Accordingly, it is desired to reduce sizes of the terminal clamps 5 and the connector 200.

Furthermore, as the headrest H with high performances are developed through providing functions of adjusting right and left position, up and down position and the like in addition to the adjustment of forth and back position, it is anticipated that the number of the sensor electrodes 26 used in the electrical capacitance sensor 100 increases. Also in this case, it is highly expected to suppress the increase of the number of the terminal clamps 5 to be connected with the terminal connecting portions and to reduce the size of the connector 200.

Responding to such demands for downsizing, the electrical capacitance sensor 100 according to the present embodiment has futures including that the number of the terminal clamps 5 to be connected with the terminal connecting portions in the connecting section 20 is suppressed thereby reducing the size of the connector 200.

In addition, an influence caused from external conductors can be avoided by providing the second guard electrode 27 on the other main surface. Therefore, it is enabled to heighten the detection accuracy while trying to reduce the size of the connecting section 20. For example in the present embodiment, the presence of metal members such as shafts supporting the headrest H may cause to deteriorate the detection accuracy in the case of providing the electrode section 10 of the electrical capacitance sensor such that the main surface of the board is along the surface of the headrest H. In such a case, it is possible to maintain the high detection accuracy by forming the second guard electrode 27 on the other main surface of the board.

Moreover, relevant to the plurality of the sensor electrodes 26a to 26e in the present embodiment, the plurality of the third terminal connecting portions 22a to 22e and the plurality of the dummy terminal connecting portions 24a to 24e are arranged to oppose one another, thereby forming the plurality of the terminal connecting portion pairs P1 to P5. Especially in the present embodiment, the terminal connecting portion pairs P1 to P6 can be clamped at the same time by the terminal clamps 5 in the same condition as for the terminal connecting portion pair P6 of the first terminal connecting portion 21 and the second terminal connecting portion 23. Therefore, it is enabled to provide a simple production process compared with the case of clamping pair-by-pair the terminal portion pairs. The larger the number of the terminals to be clamped at one time becomes for such a certain reason that the sensor electrodes 26 increase, the less time and effort the process of connecting operation requires. Particularly in the present embodiment, because the heights H of the terminal connecting portion pairs P1 to P6 are even, it is enough to set evenly pressing forces at the time of clamping between the clamping plates 5A and 5B, thereby avoiding complex production conditions.

Thus, according to the present embodiment, because the first terminal connecting portion 21, the second terminal connecting portion 23, the third terminal connecting portions 22, and the dummy terminal connecting portions 24 can be clamped at one time operation to form a connector, it is enabled to obtain uniform connecting conditions for the terminal connecting portions. As a result, the connection reliability can be improved through suppressing the variability in connecting conditions of the terminal connecting portions.

According to the present embodiment, clamping is used as a method of electrical connection for the first terminal connecting portion 21, second terminal connecting portion 23, the third terminal connecting portions 22, and the dummy terminal connecting portions 24 formed on the board 10. Therefore, electrodes on one main surface can be conducted to electrodes on the other main surface without forming through-holes and the like, and a simple production process can be obtained.

Furthermore, because the heights (thicknesses) H1 of the dummy terminal connecting portions 24 are approximately equal to the height (thickness) H2 of the second terminal connecting portion 23, uniform heights H3 can be obtained within the connecting section 20 of the board 10 to be clamped by the terminal clamps 5. Therefore, uniform pressing forces are given by the terminal clamps 5 clamping the terminal connecting portions 21, 22, 23, and 24, and the connection reliability can be improved through suppressing the variability in connecting conditions of the terminals.

In addition, in the case that the electrical capacitance sensor 100 according to the present embodiment is a sensor having an electrode section with a board of membrane, in which the electrode section is obtained by forming electrodes and wirings through a printing method on the surface of an insulating base material with flexibility, it may be hard to form through-holes as means for conducting both main surfaces of the board 10. Compared with this, regarding the electrical capacitance sensor 100 in accordance with the present embodiment, the first terminal connecting portion 21 and the second terminal connecting portion 23 formed on both main surfaces of the board 10 can be conducted by means of the terminal clamp 5.

Second Embodiment

Hereinafter, circuit conducting structures according to the second embodiment will be described.

Figure 9:
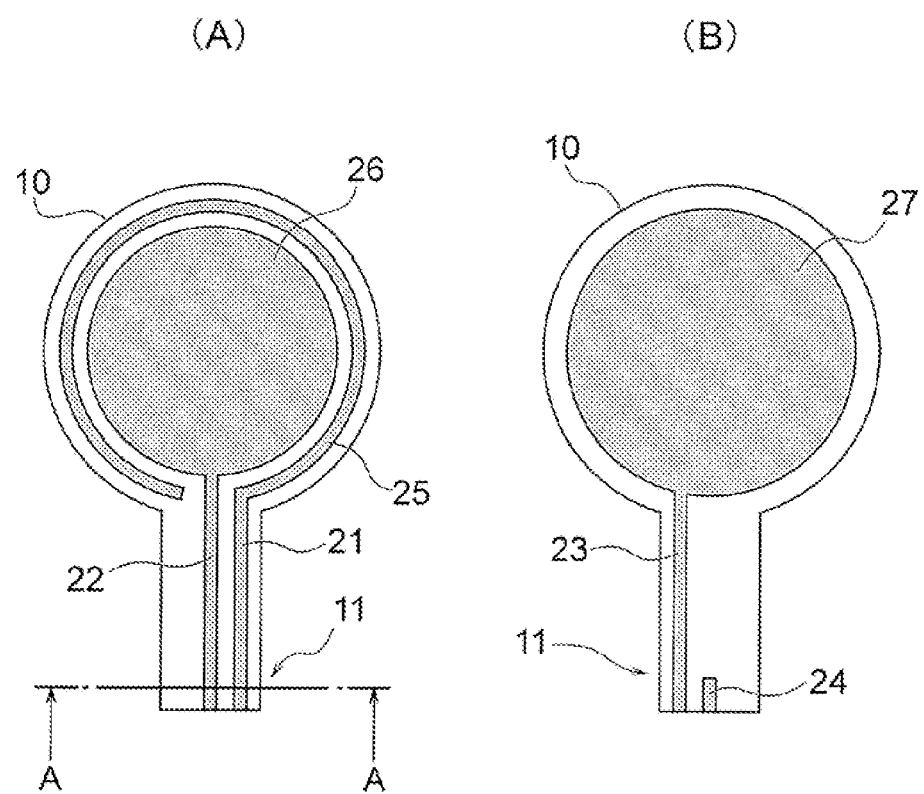
FIGS. 9A and 9B are views illustrating a circuit board according to the second embodiment of the present invention.

FIGS. 9(A) and 9(B) are views illustrating a circuit board according to the present embodiment.

More specifically, FIG. 9(A) is a view illustrating the front surface side of the circuit board according to the present embodiment, and FIG. 9(B) is a view illustrating the rear surface side of the circuit board according to the present embodiment.

As shown in FIG. 9(A), formed on the front surface of the circuit board 10 are a sensor electrode 26, a first guard electrode 25 arranged around the sensor electrode 26, a third circuit 22 having an end connected with the sensor electrode 26, and a first circuit 21 having an end connected with the first guard electrode 25. Also as shown in FIG. 9(B), formed on the rear surface of the circuit board 10 are a second guard electrode 27 and a second circuit 23 having an end connected with the second guard electrode 27.

The circuit board 10 is, for example, a flexible circuit board obtained by providing the sensor electrode 26, the first guard electrode 25, the second guard electrode 27, and the first to third circuits 21, 23, and 22 each formed of copper (Cu) foil onto an insulating base material configured of a resin sheet of polyimide, polyethylene naphthalate, polyethylene terephthalate, or the like.

On the front surface of the circuit board, the first circuit 21 has one end connected with the first guard electrode 25 and the other end reaching an end portion 11 of the circuit board, and the third circuit 22 has one end connected with the sensor electrode 26 and the other end reaching the end portion 11 of the circuit board.

Also on the rear surface of the circuit board, the second circuit 23 has one end connected with the second guard electrode 27 and the other end reaching the end portion 11 of the circuit board.

Regarding the end portion 11 of the circuit board, the circuit end of the first circuit 21 and the circuit end of the second circuit 23 are located at positions on the front and the rear surfaces of the circuit board opposing each other. Also regarding the end portion 11 of the circuit board, a dummy circuit 24 is provided such that the circuit end of the third circuit 22 and the dummy circuit 24 are located at positions on the front and the rear surfaces of the circuit board opposing each other.

Hereinafter, the situation where the circuit ends are arranged at positions on the front and the rear surfaces of the circuit board opposing one another will be described with reference to a cross sectional view.

Figure 10:
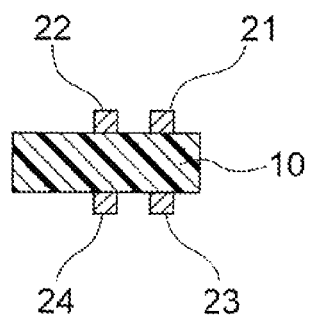
FIG. 10 is an enlarged cross sectional view of the circuit board according to the second embodiment along the line A-A in FIG. 9(A).

FIG. 10 is an enlarged sectional view of the circuit board according to the present embodiment along the line A-A in FIG. 9(A).

As shown in FIG. 10, the end portion of the second circuit 23 is elongated on the opposing surface corresponding via the circuit board 10 to the end portion of the first circuit 21 elongated to the end portion 11 of the circuit board 10, and the dummy circuit 24 is arranged on the opposing surface corresponding via the circuit board 10 to the end portion of the third circuit 22.

According to the above structure, connections for two circuits 21 and 23 can be achieved at one time through using a both-sided connecting terminal capable of connecting two circuits provided on both surfaces of the board with another circuit by clamping in up-and-down direction. Also in the same manner, connections for the circuit 22 and the dummy circuit 24 can be achieved by using a both-sided connecting terminal capable of connecting two circuits with another circuit by clamping in up-and-down direction.

Figure 11:
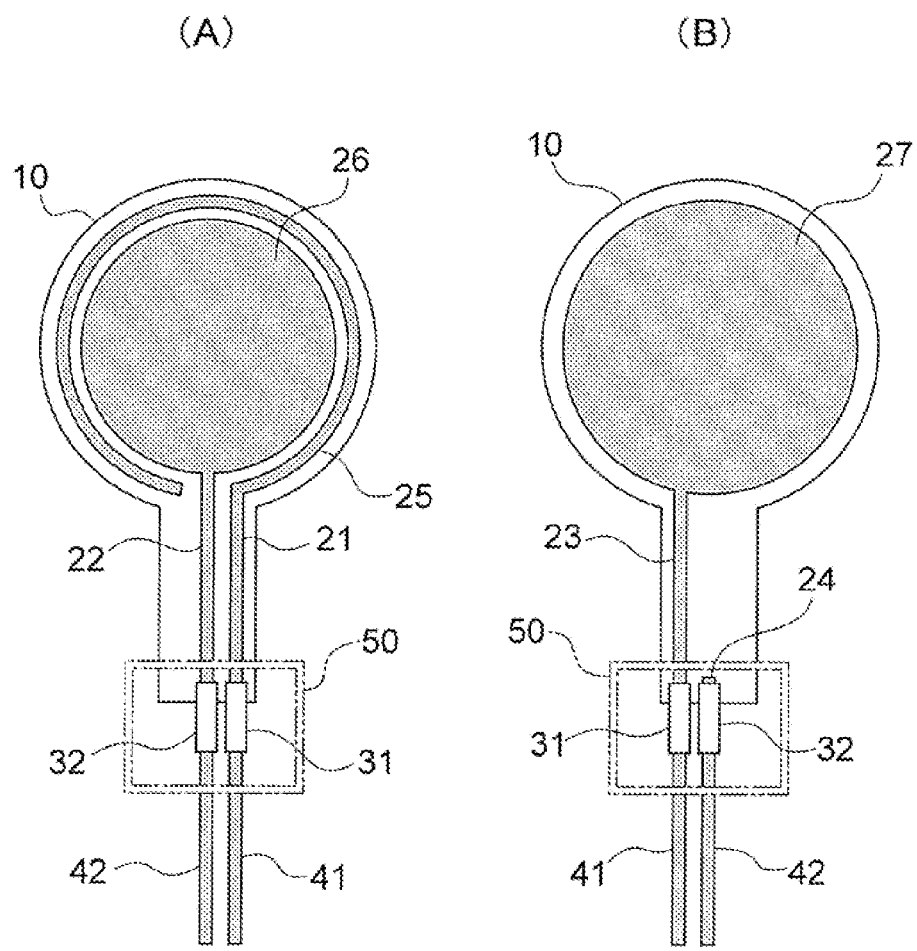
FIGS. 11A and 11B are schematic views illustrating a connecting structure according to the second embodiment.

Hereinafter, an example where the connection for each circuit is achieved by using a both-sided connecting terminal will be described with reference to the drawings. FIGS. 11(A) and 11(B) are schematic views illustrating the connecting structure according to the present embodiment.

More specifically, FIG. 11(A) is a view illustrating the front surface side of the circuit board to which the connecting structure according to the present embodiment is applied, and FIG. 11(B) is a view illustrating the rear surface side of the circuit board to which the connecting structure according to the present embodiment is applied.

As shown in FIGS. 11(A) and 11(B), the first to the third circuits 21, 23, and 22 are respectively elongated to the end portion 11 of the circuit board 10 and connected to wires 41 and 42 by means of both-sided connecting terminals 31 and 32.

In addition, the end portion 11, the both-sided connecting terminals 31 and 32, and the circuit board 10 side end portions of the wires 41 and 42 are molded by a hot melt mold 50.

In the circuit board 10 according to the present embodiment, the end portion of the first circuit 21 connected with the first guard electrode 25 and the end portion of the second circuit 23 connected with the second guard electrode 27 are clamped by the both-sided connecting terminal 31 in up-and-down direction, thereby being connected with the wire 41.

A guard voltage may be applied to the wire 41 connected with the first and the second circuits 21 and 23. In this case, it is unnecessary to apply the guard voltage independently to each of the first and the second circuits 21 and 23 through a wire.

Moreover, regarding the third circuit 22 connected with the sensor electrode 26 and having no counterpart circuit on the opposing surface of the circuit board 10, the dummy circuit 24 is provided on the opposing surface corresponding via the circuit board 10 to the end portion of the third circuit 22. Therefore, the third circuit 22 can be connected with the wire 42 by using the both-sided connecting terminal 32 to clamp the third circuit 22 and the dummy circuit 24 in up-and-down direction under the same pressure bonding condition as for a circuit end pair comprising the circuit ends of the first circuit 21 and the second circuit 23.

Accordingly, it is enabled to pressure bond a plurality of circuit end pairs in one time under the same condition by using, for example, a both-sided connecting terminal unit including the both-sided connecting terminals 31 and 32.

Through this, an advantage can be obtained that, the larger the number of the circuit end pairs to be pressure bonded at one time becomes, the less the number of connecting operation processes is.

Hereinafter, what will be described with reference to the drawings is an example in which a connecting structure is applied in the similar manner as the above embodiment to a board with a number of circuit end pairs required to be connected through the both-sided connecting terminals.

Figure 12:
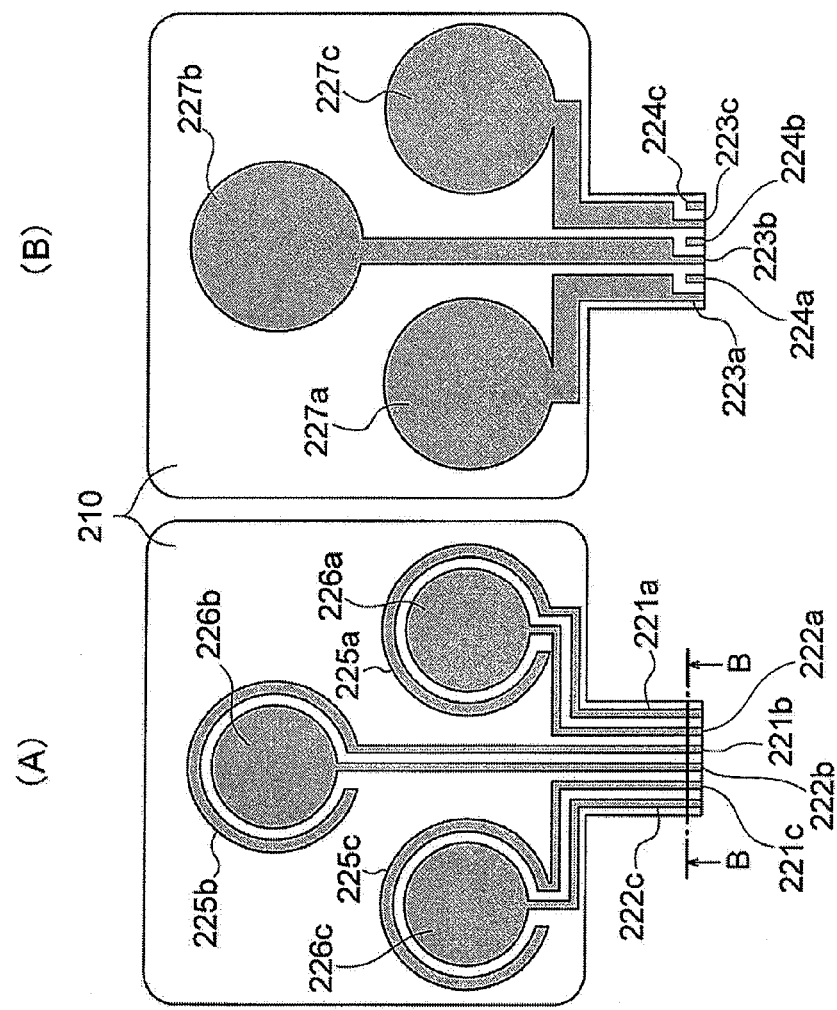
FIGS. 12A and 12B are views illustrating a circuit board for a multi channel electrical capacitance sensor.

FIGS. 12(A) and 12(B) are views illustrating a circuit board for multi channel electrical capacitance sensor.

More specifically, FIG. 12(A) is a view illustrating the front surface side of the circuit board for multi channel electrical capacitance sensor, and FIG. 12(B) is a view illustrating the rear surface side of the circuit board for multi channel electrical capacitance sensor.

As shown in FIG. 12(A), formed on the front surface of the circuit board 210 are three sensor electrodes 226a to 226c, three first guard electrodes 225a to 225c arranged respectively around the sensor electrodes 226a to 226c, three third circuits 222a to 222c having ends connected respectively with the sensor electrodes 226a to 226c, and three first circuits 221a to 221c having ends connected respectively with the first guard electrodes 225a to 225c. Also as shown in FIG. 12(B), formed on the rear surface of the circuit board 210 are three second guard electrodes 227a to 227c and three second circuits 223a to 223c having ends connected respectively with the second guard electrodes 227a to 227c.

The circuit board 210 is, similarly as the above embodiment, a flexible circuit board obtained by providing the sensor electrodes 226a to 226c, the first guard electrodes 225a to 225c, the second guard electrodes 227a to 227c, and the first to third circuits 221a to 221c, 223a to 223c, and 222a to 222c each formed of copper (Cu) foil onto an insulating base material configured of an insulating sheet of polyimide, polyethylene naphthalate, polyethylene terephthalate, or the like.

On the front surface of the circuit board, the three first circuits 221a to 221c have one ends connected respectively with the first guard electrodes 225a to 225c and the other ends reaching an end portion 211 of the circuit board, and the three third circuits 222a to 222c have one ends connected respectively with the sensor electrodes 226a to 226c and the other ends reaching the end portion 211 of the circuit board.

Also on the rear surface of the circuit board, the three second circuits 223a to 223c have one ends connected respectively with the second guard electrodes 227a to 227c and the other ends reaching the end portion 211 of the circuit board.

Regarding the end portion 211 of the circuit board, the circuit ends of the three first circuits 221a to 221c and the circuit ends of the three second circuits 223a to 223c are located at positions on the front and the rear surfaces of the circuit board opposing one another. Also regarding the end portion 211 of the circuit board, three dummy circuits 224a to 224c are provided such that the circuit ends of the three third circuits 222a to 222c and the dummy circuits 224a to 224c are located respectively at positions on the front and the rear surfaces of the circuit board opposing one another.

Hereinafter, the situation where corresponding circuit ends are arranged at positions on the front and the rear surfaces of the circuit board opposing one another will be described with reference to a cross sectional view.

Figure 13:
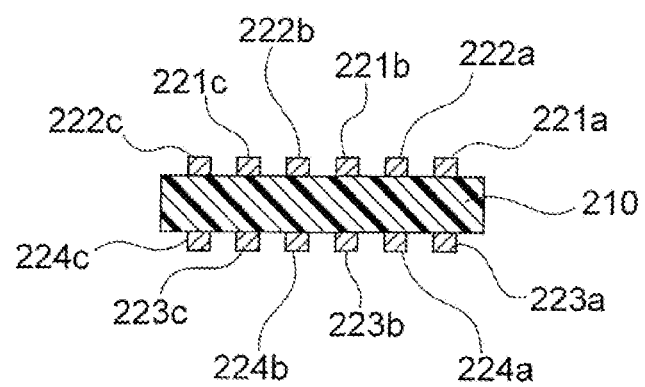
FIG. 13 is an enlarged sectional view of the circuit board for the multi channel electrical capacitance sensor along the line B-B in FIG. 12(A).

FIG. 13 is an enlarged sectional view of the circuit board for the multi channel electrical capacitance sensor along the line B-B in FIG. 12(A).

As shown in FIG. 13, the end portions of the second circuits 223a to 223c are elongated on the opposing surface corresponding via the circuit board 210 to the end portions of the first circuits 221a to 221c elongated to the end portion 211 of the circuit board 210, and the dummy circuits 224a to 224c are arranged on the opposing surface corresponding via the circuit board 210 to the end portions of the third circuits 222a to 222c.

According to the above structure, connections for respective two circuits of the first circuits 221a to 221c and the second circuits 223a to 223c can be achieved at one time through using both-sided connecting terminals each capable of connecting two circuits provided on both surfaces of the board with another circuit by clamping in up-and-down direction. Also in the same manner, connections for the third circuits 222a to 222c and the dummy circuits 224a to 224c can be achieved by using both-sided connecting terminals each capable of connecting two circuits with another circuit by clamping in up-and-down direction.

Six circuit end pairs are formed on the end portion 211 of the circuit board 210, and the both-sided connecting terminal is to be attached to each circuit end pair. If the dummy circuits 224a to 224c are absent, differences in thicknesses among the circuit end pairs may occur when trying to attach six both-sided connecting terminals to the circuit end pairs at one time, thereby deteriorating the reliability of the connection between each both-sided connecting terminal and each circuit.

According to the present embodiment, the differences in thicknesses among the circuit end pairs are prevented from occurring because the dummy circuits 224a to 224c are provided. Therefore, it is enabled to press bond the circuit end pairs of the third circuits 222a to 222c and the dummy circuits 224a to 224c under the same press bonding condition as for the circuit end pairs of the circuits 221a to 221c and the second circuits 223a to 223c.

Although the above embodiment is described for the example of the flexible circuit board, the present invention is not limited to the example. It is to be noted that the flexible circuit board should be understood as including a membrane obtained by printing silver paste as electrodes and circuits onto an insulating base material of insulating film formed of polyethylene naphthalate, polyethylene terephthalate, or the like.

DESCRIPTION OF REFERENCE NUMERALS

1000; headrest position adjusting apparatus
100; electrical capacitance sensor
110; sensor circuit
10; electrode section, board, or circuit board
   11; end portion
   20; connecting section
   21; first terminal connecting portion or first circuit
   221*a* to 221*c*; first circuits
   23; second terminal connecting portion or second circuit
   223*a* to 223*c*; second circuits
   22, 22*a* to 22*e*; third terminal connecting portion or third circuit
   222*a* to 222*c*; third circuits
   24, 24*a* to 24*e*; dummy terminal connecting portion or dummy circuit
   224*a* to 224*c*; dummy circuits
   25, 225*a* to 225*c*; first guard electrode
   27, 227*a* to 227*c*; second guard electrode
   26, 26*a* to 26*e*, 226*a* to 226*c*; sensor electrode
   28, 28*a* to 28*e*; connecting wiring
   31, 32; both-sided connecting terminal
   41, 42; wire
   50; hot melt mold
200; connector
   3; opening
   5; terminal clamp
   5A; upper clamping plate
   5B; lower clamping plate
   6; barrel (hook)
   9; connector housing

What is claimed is:

1. An electrical capacitance sensor comprising:
a board having a one main surface and an other main surface;
a sensor electrode formed on the one main surface of the board and detecting an electrical capacitance between the sensor electrode and an object;
a first guard electrode formed on the one main surface of the board and in a vicinity of the sensor electrode;
a second guard electrode formed on the other main surface of the board, wherein a first terminal connecting portion for the first guard electrode and a second terminal connecting portion for the second guard electrode are provided at positions opposing each other;
a third terminal connecting portion for the sensor electrode, the third terminal connecting portion being formed on the one main surface of the board; and
a dummy terminal connecting portion formed at a position opposing the third terminal connecting portion and on the other main surface of the board,
wherein the dummy terminal connecting portion has a height approximately equal to a height of the second terminal connecting portion.

2. The electrical capacitance sensor as recited in claim 1, wherein
a terminal clamp having a pair of clamping plates for clamping the board from both surface sides is attached to each of a pair of the first terminal connecting portion and the second terminal connecting portion and a pair of the third terminal connecting portion and the dummy terminal connecting portion.

3. The electrical capacitance sensor as recited in claim 1, wherein
the dummy terminal connecting portion is formed of a conductive material same as for the second terminal connecting portion.

4. The electrical capacitance sensor as recited in claim 1, wherein
a pair of the third terminal connecting portion and the dummy terminal connecting portion opposing each other comprises a plurality of pairs of the third terminal connecting portions and the dummy terminal connecting portions, and the plurality of pairs are arranged in substantially parallel to one another.

5. The electrical capacitance sensor as recited in claim 1, wherein the board is provided as a membrane having an electrode section.

* * * * *